United States Patent
Williams

(10) Patent No.: US 7,592,826 B1
(45) Date of Patent: Sep. 22, 2009

(54) METHOD AND APPARATUS FOR DETECTING EM ENERGY USING SURFACE PLASMON POLARITONS

(75) Inventor: Brett A. Williams, Iowa City, IA (US)

(73) Assignee: Lockheed Martin Corporation, Bethesda, MD (US)

( * ) Notice: Subject to any disclaimer, the term of this patent is extended or adjusted under 35 U.S.C. 154(b) by 169 days.

(21) Appl. No.: 11/589,937

(22) Filed: Oct. 31, 2006

Related U.S. Application Data

(60) Provisional application No. 60/809,343, filed on May 31, 2006.

(51) Int. Cl.
*G01R 31/26* (2006.01)
*G01R 31/302* (2006.01)

(52) U.S. Cl. .................. 324/765; 324/750; 324/753
(58) Field of Classification Search .................. None
See application file for complete search history.

(56) References Cited

U.S. PATENT DOCUMENTS

| | | | | |
|---|---|---|---|---|
| 4,556,790 A | * | 12/1985 | Glass et al. | 257/431 |
| 5,858,799 A | * | 1/1999 | Yee et al. | 436/164 |
| 6,851,645 B1 | | 2/2005 | Williams et al. | |
| 2003/0164947 A1 | * | 9/2003 | Vaupel | 356/445 |

OTHER PUBLICATIONS

Barnes, William L., et al., "Surface Plasmon Subwavelength Optics." Nature, vol. 42d, Aug. 14, 2003, pp. 824-830.

* cited by examiner

*Primary Examiner*—Minh N Tang
(74) *Attorney, Agent, or Firm*—Buchanan Ingersoll & Rooney PC

(57) ABSTRACT

An apparatus and method are disclosed for detecting electromagnetic (EM) energy. An exemplary apparatus includes a dielectric layer for receiving incident EM energy, a metal film and a circuit. The metal film has a first surface adjacent to the dielectric layer and has a thickness selected to stimulate surface plasma polaritons on a second surface of the metal film for electromagnetic energy having a given electromagnetic wavelength incident on the dielectric layer. The circuit determines an incident angle of the incident electromagnetic energy on the dielectric based on the EM energy from the stimulated surface plasmon polaritons. The azimuth and elevation of the incident EM energy can also be determined.

17 Claims, 6 Drawing Sheets

METHOD AND APPARATUS FOR DETECTING EM ENERGY USING SURFACE PLASMON POLARITONS

BACKGROUND

A method and apparatus are disclosed for detecting electromagnetic (EM) energy.

Surface plasmon polaritons are surface plasmons which are associated with incident light waves that result when free space electromagnetic waves couple to free electron oscillations (surface plasmons) in metal. Surface plasmon polaritons are lightwaves trapped on a conductive metal surface due to their interactions with electrons on the conductive metal surface.

Metal supports collective surface oscillations of free electrons. These collective surface oscillations can concentrate electromagnetic fields on the nanoscale, enhancing local field strength in a particular direction by several orders of magnitude. Plasmon characteristics can be accessed at optical and radio wavelengths. Normal propagating electromagnetic (EM) waves have constant phase and amplitude in the same plane. Surface plasmons and surface plasmon polaritons have planes of constant phase perpendicular to those of constant amplitude, i.e. both are forms of evanescent waves.

The primary responders to EM waves are electrons followed by polar molecules. Even low inertia electrons can fail to keep up with high frequencies depending on material used in constructing a detector. The dependence on material is described by the index of refraction (or dielectric constant or relative permittivity) and is a function of EM frequency.

This dependence on index of refraction and on frequency (or wavelength) is called a "dispersion relation". Surface plasmons on a smooth planar metal display non-radiative electromagnetic modes, i.e., the surface plasmons cannot decay spontaneously into photons nor can light be coupled directly with surface plasmons.

The reason for this non-radiative nature of surface plasmons is that interaction between light and surface plasmons cannot simultaneously satisfy energy and momentum conservation; the conservation of parallel momentum is not satisfied as represented by the momentum wave-vector, k (where the magnitude of $k=2\pi/\lambda$, with $\lambda$ being the EM wavelength). When surface plasmons and light are made to be in resonance, the result is a "surface plasmon polariton". The surface plasmon polariton is an electromagnetic field in which both light and electron wave distributions match in their momentum vector, i.e. they have the same wavelength. This is also true for non-optical EM energy, e.g., radio waves.

Resonance and field enhancement can be made to take place if the electromagnetic momentum wave vector is increased as in a transparent medium with an index of refraction, n, to match incident EM energy to the surface plasmon momentum wave-vector, or inversely, resonance can be achieved by roughening the metal surface to impose a surface impedance (i.e. along the dielectric/metal interface) in order to match free space electromagnetic waves to surface plasmons. In practice, momentum restrictions can be circumvented by either a prism coupling technique to shorten electromagnetic wavelength or by a metal surface grating, nanostructures such as holes, dimples, posts or statically rough surfaces. This resonance results in the fields associated with moving electron collections enhancing that of electromagnetic waves at the matched wavelength.

There are a number of known ways in which to create surface plasmon polaritons, for example, the Kretchmann-Rather attenuated total reflection configuration comprised of a dielectric prism mated with a thin metal film. For the Kretchmann-Rather configuration, a plasmon does not ride on the dielectric/metal interface. Plasmons arise instead on the back, metal/air interface. Once EM waves incident on the dielectric/metal interface exceed the so-called critical angle of total internal reflection they establish evanescent waves which penetrate the metal film to some skin depth. Such light induced evanescent waves excite surface plasmon polaritons on the side of the metal opposite the dielectric.

SUMMARY

Disclosed is an exemplary apparatus for detecting received electromagnetic (EM) energy, comprising a dielectric layer for receiving incident EM energy, a metal film and a circuit. The metal film has a first surface adjacent the dielectric layer. The metal film also has a thickness selected to stimulate surface plasmon polaritons on a second surface of the metal film for EM energy having a given EM wavelength incident on the dielectric layer. The circuit is provided for determining an incident angle of the incident EM energy based on EM energy from the stimulated surface plasmon polaritons.

Also disclosed is an exemplary method for determining an incident angle of received electromagnetic (EM) radiation. The method comprises receiving an EM wave on a surface of plural windows, each comprising a dielectric medium adjacent to a metal film, wherein the metal film has a first surface and a second surface; measuring a first amplitude of EM energy generated on the second surface of the metal film adjacent to the dielectric medium of a first of the plural windows; measuring a second amplitude of EM energy generated on the second surface of the metal film adjacent to the dielectric medium of a second of the plural windows which is geometrically opposed to the first window; combining the measured first amplitude with a second amplitude to produce a difference value and a summed value of the first and second measured amplitudes; dividing the difference value by the summed value to output a resultant value representing the incident angle of the received EM wave.

Also disclosed is an exemplary apparatus for detecting radio frequencies (RF), comprising a dielectric layer, a metal film having a first surface adjacent the dielectric layer, the metal film having a thickness selected to stimulate surface plasmon polaritons on a second surface of the metal film for a given RF wavelength incident on the dielectric layer, and a circuit for detecting electromagnetic energy generated by the surface plasmon polaritons to produce and output a signal proportional to the RF wavelength.

BRIEF DESCRIPTION OF THE DRAWINGS

Exemplary embodiments will be described in relation to the following figures wherein.

DETAILED DESCRIPTION

Figure 1:
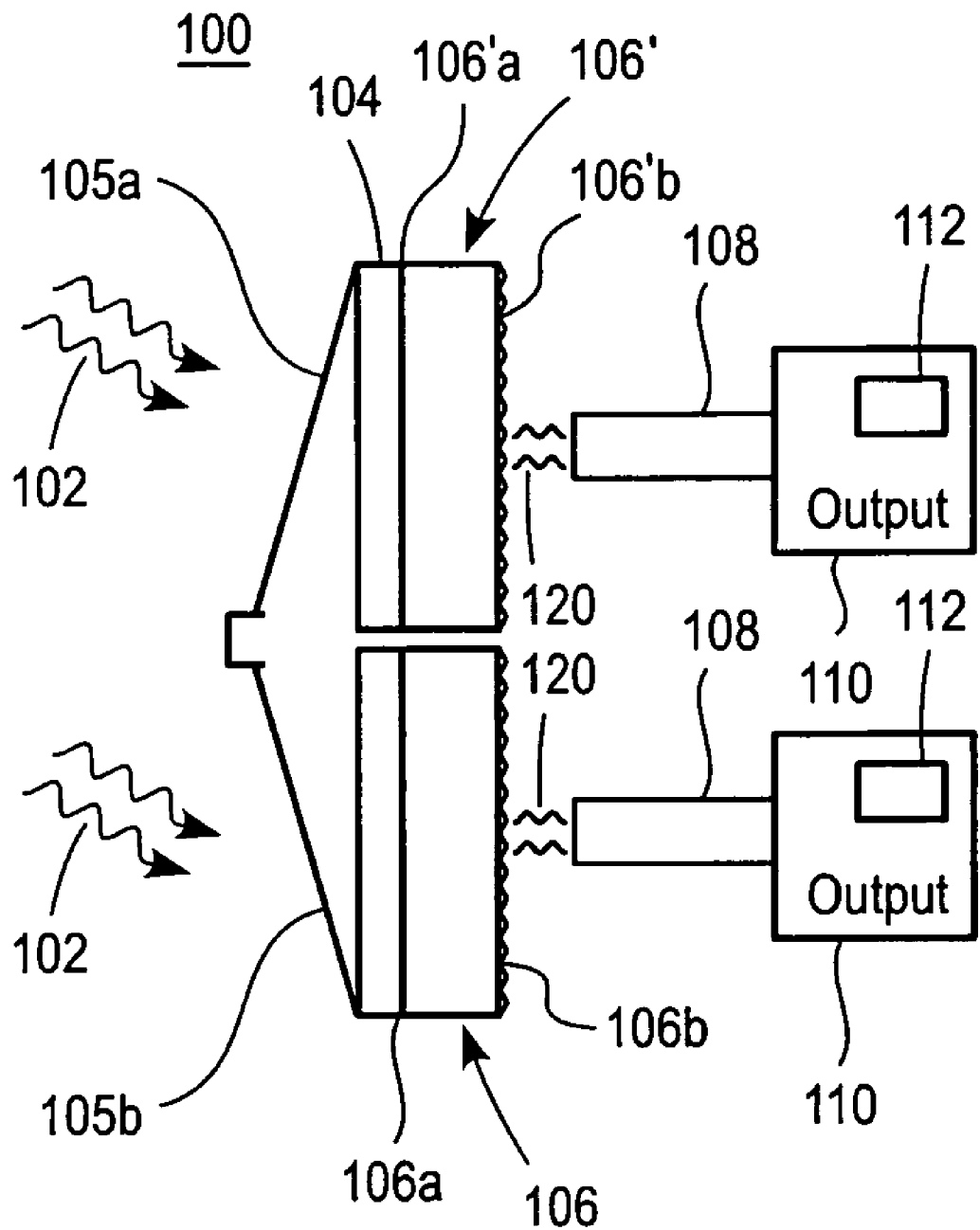
FIG. 1 illustrates an exemplary embodiment of an apparatus.

FIG. 1 illustrates an exemplary apparatus configured as a detector 100 for detecting electromagnetic (EM) energy 102.

Plural detectors 100 comprise dielectric layers 104 for receiving incident EM energy, metal films 106, and circuits 110. The dielectric layers 104 and metal films 106 are arranged in an exemplary embodiment one on top of another in the form of plural windows or antennae, 105a and 105b. Although only two windows are described, more windows or antennae can be used.

The dielectric layer 104 can be a Duroid or similar medium having an index of refraction of approximately 1.5 or lesser or greater. The dielectric layer 104 can have a thickness of approximately 0.100 inches or lesser or greater.

The metal film 106 is adjacent to the dielectric layer 104 (e.g., in direct contact, or in sufficiently close proximity as to function in accordance with the objectives described herein). The metal film 106 can be a metal such as silver, gold, or aluminum or an alloy. Besides metals like silver, gold or aluminum, polaritons as employed by this application may also propagate in semiconductor materials and doped semiconductor materials as long as their charge density results in a plasma frequency at least sqrt(2) times that of the incident frequency of interest, thus resulting in a permitivitty real part less than negative one. Intrinsic semiconductors, such as Germanium, provide change densities high enough that a negative index can be satisfied below 10 GHz radio frequencies, while doped materials like 4H-SiC doped with $2\times10^{17}$ cm$^{-3}$ nitrogen donor atoms at 300K more than satisfy a negative index well above 10 GHz radio frequencies. In an exemplary optical domain, the thickness of the metal film 106 can be within the range of approximately 20 nanometers to 80 nanometers or more or less as desired for a given application. In radio frequency applications, the metal film thickness can be 0.001 to 0.00004 inches, or more or less as desired for a given application. For example, in an application employing X-band frequency (e.g., 8-12 GHz), the thickness of the metal film can, for example, be within the range of 0.00004 inches.

The length of the dielectric layer 104 and metal film 106 can be approximately 1.25 inches in length, (or more or less) as desired for a given application and the EM energy 102 to be detected.

The metal film 106 has a first surface 106a that is adjacent to the dielectric layer 104, and a second surface 106b that is adjacent to a waveguide 108. The metal film 106 has a thickness selected to stimulate surface plasmon polaritons on the second surface 106b of the metal film 106 for EM energy 102 having a given EM wavelength incident on the dielectric layer beyond a critical angle (e.g., an angle of EM incidence at which surface plasmon polaritons are generated after attenuated total internal reflection from the dielectric interface creates evanescent waves in the metal). Different metals, for example, gold and silver, can be used to provide different contributions to accuracy. Gold and silver can, for example, offer a desired field of view of, for example, ±10°.

As the incident angle of the received electromagnetic energy 102 on the outer dielectric surface increases, the amount of energy transmitted into the dielectric medium decreases and energy 120 from the surface plasmon polaritons also decreases. When the incident angle on a first dielectric interface (e.g. air/dielectric) increases or extends past 90°, little or no further transmission into the dielectric occurs. The circuit 110 determines an incident angle of the incident EM energy 102 based on EM energy from the stimulated surface plasmon polaritons.

To facilitate collecting EM energy, the second surface 106b of the metal film 106 can be roughened in comparison to the first surface 106a of the metal film. The roughness of the second surface 106b of the metal film 106 can be selected to produce a desired amplitude of the EM energy 120 generated at the second surface 106b by the stimulated surface plasmon polaritons. This roughness can be within the range of approximately $1/500^{th}$ or $1/1000^{th}$ (or lesser or greater as desired for a given application) of the EM wavelength 102 received at the surface of the dielectric 104. The surface plasmon polaritons can serve as an intermediary of incident EM energy, i.e. surface plasmon polaritons escort energy through the metal film over a narrow range of incident angles upon the dielectric/metal interface while rejecting those incident angles outside the range of angles.

The thickness of the metal film can be less than a skin depth of a photonic evanescent wave penetrating the metal from the maximum skin depth of the photonic evanescent wave at the first interface of the dielectric layer 104 and the metal film 106. This roughness on the second surface 106b of the metal film 106 can be created by etching, lithography, grating, "sand blasting" utilizing small plastic pellets as the "sand", or other suitable methods for providing a desired roughness. The roughness can be used to generate and enhance the EM energy 120 output by the surface plasmon polaritons. The first surface 106a of the metal film 106 of the detector 100 can be warped to provide a selected and fixed field of view.

The circuit 110 includes a processor 112 having at least one channel for determining the incident angle of the EM energy 102 on the dielectric layer 104. Unambiguous target angle determination can use one set of paired antennas for both elevation and azimuth axes. However, for an application with a fixed target reflection amplitude, a single channel can be used. Of course, multiple channels can be used as is known in the art of target tracking and detection.

The detector 100 can comprise a waveguide 108 for transporting the EM energy 120 from the surface plasmon polaritons to the circuit 110. The waveguide can be an RF waveguide or a fiber optic cable or other suitable transport path.

The circuit 110 detects an amplitude of the EM energy 120 generated by the surface plasmon polaritons to determine the incident angle of the EM energy 102 on the dielectric layer 104. The circuit 110 can also be configured to determine an elevation of the EM energy 102 incident on the dielectric layer 104.

Figure 2:
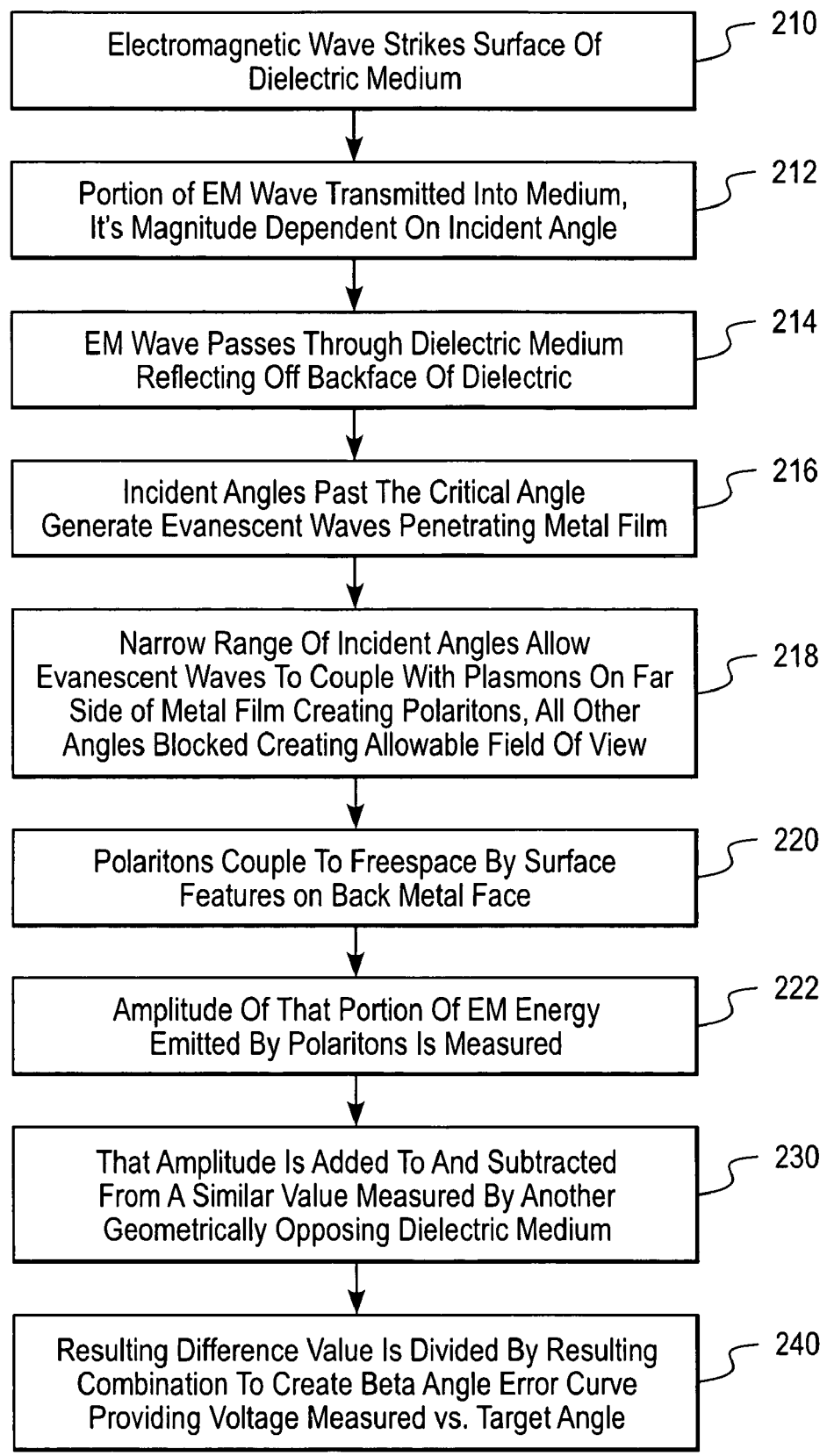
FIG. 2 is a flow chart of an exemplary method according to an embodiment.

FIG. 2 illustrates an exemplary embodiment by which the detector 100 determines the incident angle of EM energy 102. The exemplary method utilizes the detector 100 having a dielectric medium 104 adjacent to a metal film 106, wherein the metal film 106 has a first surface 106a and a second surface 106b.

In an exemplary method, an EM wave is received on the surface of plural windows 105a and 105b, which each comprise a dielectric medium 104 adjacent to a metal film 106. The windows 105a and 105b can be openings in which the dielectric medium 104 is positioned within a housing. The metal films 106 and 106' have a first surface 106a, 106'a and a second surface 106b, 106'b. A first amplitude of EM energy generated on the second surface 106b of the metal film 106 of a first of the plural windows 105b is measured. A second amplitude of EM energy generated on the second surface 106'b of the metal film 106' of a second of the plural windows 105a which is geometrically opposed to the first window 105b is also measured combining the measured first amplitude with a second amplitude to produce a difference value and a summed value of the first and second measured amplitudes; dividing the difference value by the summed value to output a resultant value representing the incident angle of the received EM wave. A portion of EM energy from the received EM wave is transmitted into the dielectric medium, with a magnitude dependent on incident angle (step 212). At step 214, the transmitted EM wave passes through the dielectric medium reflecting off the backface of the dielectric 104.

At incident angles greater than the critical angle, photon evanescent waves are generated (step 216), penetrating the metal film 106. Only a narrow range of incident angles on the dielectric 104 backface will couple with plasmons on the far metal side thus creating a field-of-view that may be tuned through warping the dielectric 104/metal film 106 interface. Polaritons couple to free space based on surface features on the back metal face.

The amplitude of the EM energy 120 generated on the second surface 106b of the metal film 106 adjacent to the dielectric medium 104 and emitted into free space can be measured (step 222). Where more than one dielectric medium 104 (i.e. window/antenna) is used, measured amplitudes at plural windows can be combined. For example, a first amplitude of EM energy generated on the second surface of the metal film of a first window in step 220 can be combined (e.g., added) with the measured amplitude at a geometrically opposing second surface of a metal film 106 adjacent to another dielectric medium 104 in a second window (step 230). Step 230 can include subtracting the measured amplitude at a second surface 106b of the metal film 106 adjacent to one of the dielectric medium 104 from the measured amplitude of the another dielectric medium 104.

The values of the measured amplitudes can be combined to produce a difference value and a summed value representing a resulting combination value. The difference value can be divided by the summed value (step 240) to create a beta angle error curve providing, for example, voltage measured versus target angle. Based on the result of that ratio, a value can be output indicating the incident angle of the received EM wave, referred to herein as a monopulse angle detection. The value indicating the incident angle of the received electromagnetic wave can be determined by creating a beta angle error curve relating target angle to measured amplitude (e.g., voltage measured versus target angle).

The detector can have numerous applications. For example, in a missile system, the detector can use the generated EM energy 120 to determine an incident angle and/or an elevation and/or an azimuth of received EM energy 102. The determined incident angle and elevation can be used to provide error tracking correction signals to a missile, and assist in guiding the missile to an object from which the electromagnetic energy 102 is received.

The value indication of the incident angle can be a voltage, which represents the angle in degrees of the detector from the boresight of the missile to the target. A range of voltage values can be used to create a beta angle error curve, for example, having normalized measured amplitude in volts on a first axis and an angle off boresight measured in degrees on a second axis. The error curve data can be stored, for example, in a look-up table. Where multiple dielectric medium/metal films are used, for example, two areas of dielectric medium/metal films, on an air vehicle radome, the incident EM energy received at the two dielectric medium/metal films can be substantially equal when the missile is tracking on the boresight.

The detector can be, in an exemplary embodiment, distributed about quadrants of a radome, conforming to sleek radome surface curvatures, avoiding high drag, slow speed hemispherical domes associated with optical quad seekers. The detector can, for example, conform to a radome surface (e.g., the radome outer surface) and can protrude into the radome volume. The detector can allow radome volume typically filled with air to be used by lethality enhancement devices or other seekers if desired.

The field of view of the detector can be set by a suitable choice of dielectric/metal film curvature on the first surface. The dielectric/metal interface curvature can be chosen to maximize accuracy by using a steepest slope of surface plasmon polariton resonance as seen in emission peaks enabled by metal/air surface roughness. The dielectric/metal interface curvature can be chosen to maximize detection range in a specified direction by appropriate placement of maximum surface plasmon polariton enhancement with respect to the field of view.

Where resonant peaks over angle are too narrow, the curvature to be defined can expand this region by spreading out a wide angular field of view over a small region of incidence angle at the dielectric/metal film interface. The wider the field of view is spread, the lower the contribution to the accuracy over the Fresnel method as described in U.S. Pat. No. 6,851,645 to Williams et al. entitled "Non-Coherent Fresnel Direction Finding Method and Apparatus", the entire disclosure of which is incorporated herein by reference.

Figure 3:
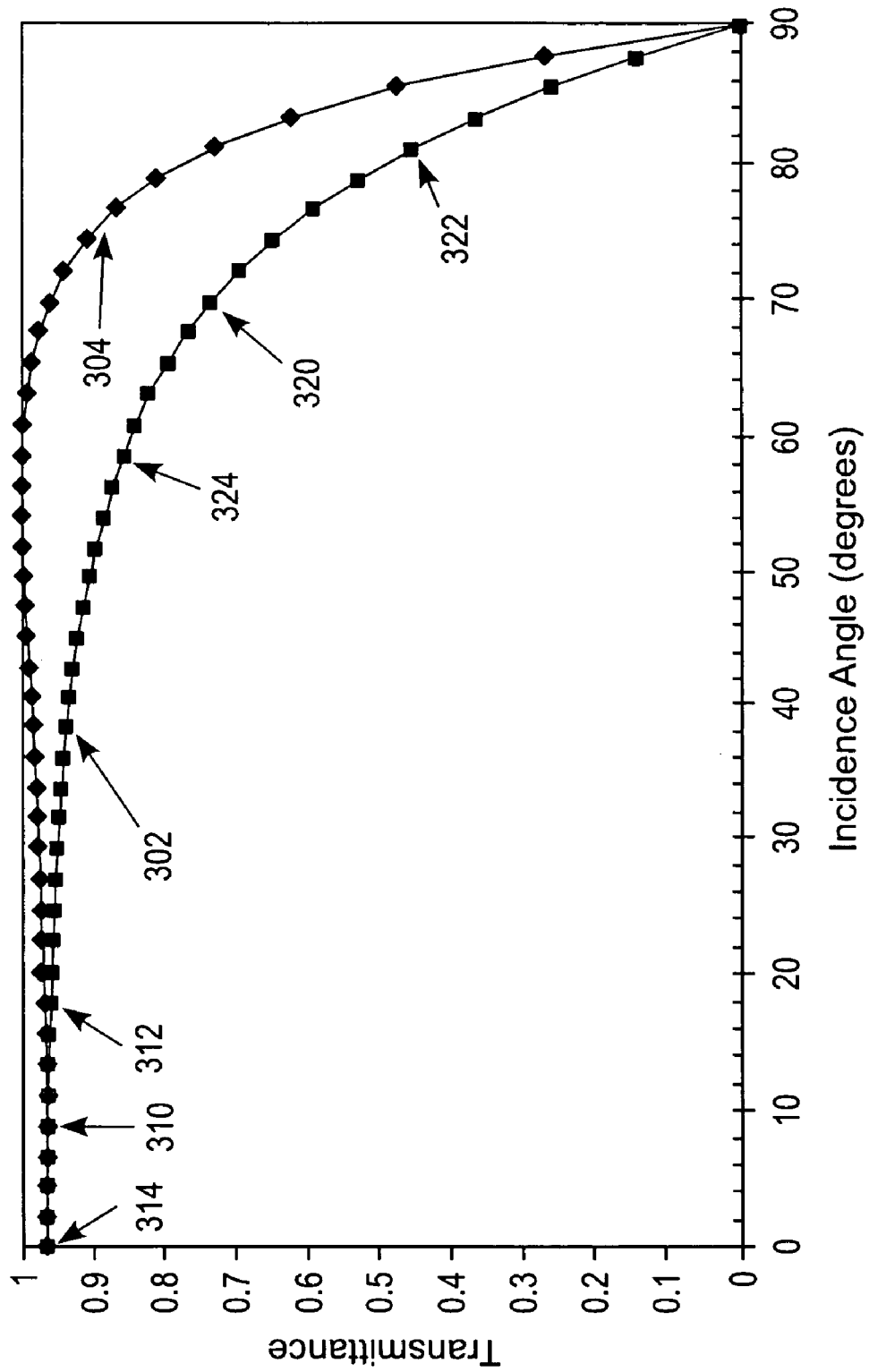
FIG. 3 is a plot showing the Fresnel transmittance of radiation through an air/fused silica interface of an embodiment.

To accommodate high velocities for a guided munition, a steeply raked radome can be used. As seen in FIG. 3a, the transmittance of radiation, as a percentage, through a medium having a refractive index=1.5 is a strong function of both incidence angle and polarization, where 302 is parallel polarization and 304 is perpendicular polarization, both based upon Fresnel's transmission equations.

At low incident angles, such as point 310, at 10 degrees, for example, corresponding to a blunt or hemispherical radome, Fresnel transmittance is not a strong function of angle. For example, at an incident angle of 10 degrees, radiation received within an angle of plus 10 degrees (point 312) to minus 10 degrees (point 314) shows virtually no difference in Fresnel transmittance, regardless of polarization. In other words, the instantaneous rate of change of the Fresnel transmittance as a function of angle of incidence at 10 degrees is approximately zero.

In contrast, an incident angle of 70 degrees (point 320), for example, corresponding to a light ray on boresight upon a relatively sleek radome can show significant differences in Fresnel transmittance for angles plus or minus 10 degrees, for example. In other words, the instantaneous rate of change of the Fresnel transmittance as a function of angle of incidence at 70 degrees is significantly different from zero, i.e., the Fresnel transmittance is rapidly changing as a function of angle of incidence. For an incident angle of 70 degrees, for example, radiation received within an angle of plus 10 degrees (point 322, 45% transmittance) to minus 10 degrees (point 324, 85% transmittance) shows a difference in Fresnel transmittance of 40% for perpendicularly polarized radiation.

Thus, a sleek radome system using the Fresnel transmittance can have a greater angular sensitivity than a blunt or hemispherical radome system. For guidance control of, for example, a high velocity munition, the guidance system can involve high angular sensitivity. Because the Fresnel transmittance is a strong function of incidence angle, yielding greater angular sensitivity, application of this varying transmittance for guidance purposes can be useful. The incidence angle can be selected such that the Fresnel transmittance of the radiation varies significantly over the desired field of view, i.e., the slope of the Fresnel transmittance is significantly different from zero. The above example employed a field of view of plus or minus 10 degrees and a medium of refractive index=1.5. Under these exemplary conditions, a minimum angle of incidence of at least approximately 60 degrees is preferred, with at least approximately 70 degrees being more preferred. The maximum incidence angle is approximately 80 degrees when a plus or minus 10 degree field of view is required.

Figure 4A:
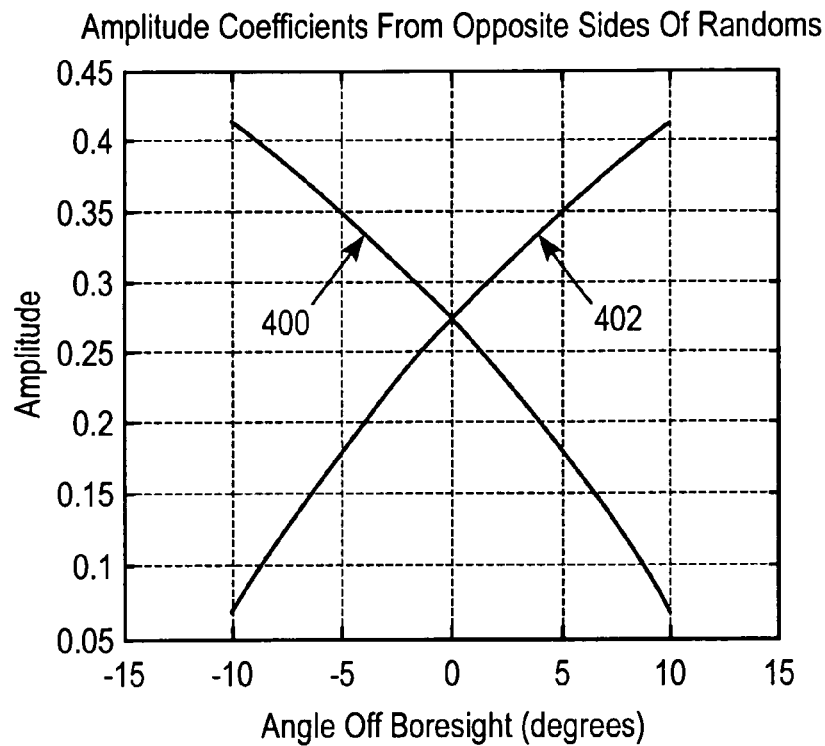
FIGS. 4A-4D are plots of various signals within an embodiment.

FIGS. 4A-4D illustrate various exemplary signals which may be generated within the exemplary apparatus. FIG. 4A illustrates the detection signals of an opposing pair of detectors 106 and 106', which can be oriented, for example, as top and bottom windows/detectors or right and left windows/detectors. To determine the incident angle of the received EM wave, which combines first surface and geometrically opposing second surface Fresnel transmission amplitudes, each can be measured to change due to variations in received EM wave incident angles on the dielectric surfaces presenting high incidence angles in a preferred direction by virtue of geometric placement of the dielectric mediums.

As an example, curve 400 corresponds to the amplitude measured at the detector 106 and curve 402 corresponds to amplitude measured at the detector 106'. In this instance, the curve 400 of the detector 106 indicates the highest amplitude when the EM energy is incident at an angle to the left off boresight and continuously decreases as the EM energy is incident at angles increasingly to the right off boresight. This decrease in the measured amplitude at detector 106 is due to the decreasing Fresnel transmittance as the angle of incidence increases from left off boresight to right off boresight.

Figure 4B:
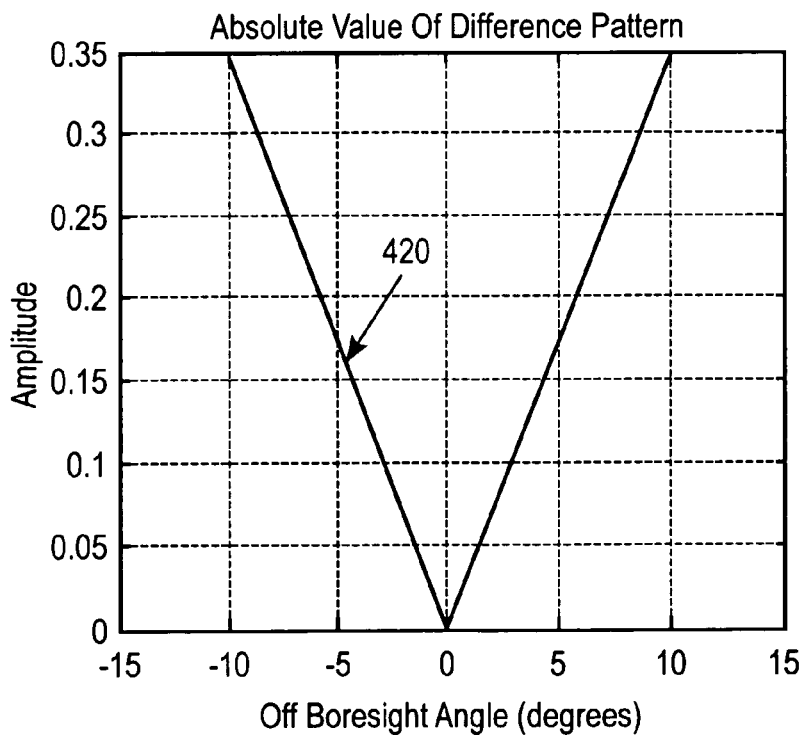
Figure 4C:
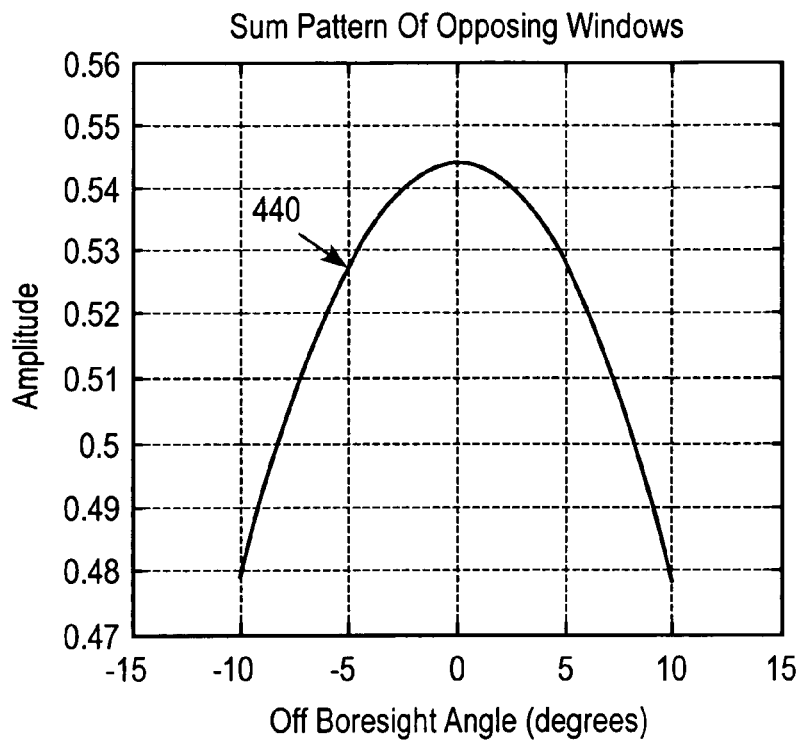
Figure 4D:
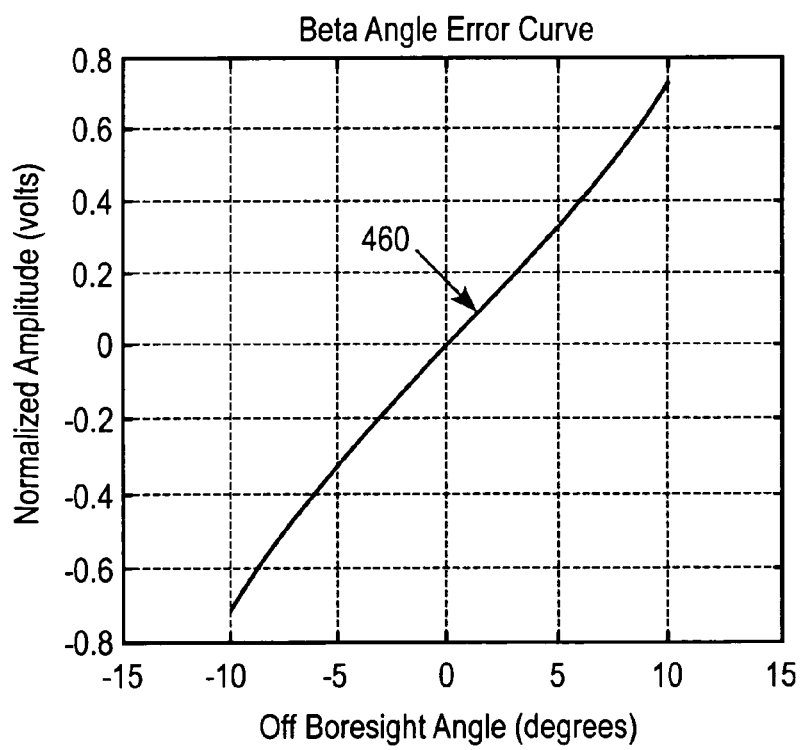

FIG. 4B illustrates the absolute value of the difference 420 between the first and second measured amplitudes of the detectors 106 and 106'. FIG. 4C illustrates the sum 440 of the measured amplitudes of the detectors 106 and 106'. FIG. 4D illustrates the difference of the first and second measured amplitudes 420 divided by the sum of the first and second measured amplitudes 440, creating a beta angle error curve 460.

Different metals employed at the interface with the dielectric, for example, can have more or less pronounced resonance, affecting incident angles (which stimulate plasmons) and thus curvature of the dielectric/metal film interface. This interface surface can be aspheric, though only very slightly different from planar, (e.g., less than 1°). Over the interface surface not all incoming rays will meet the dielectric/metal interface at the same incident angles. Thus, enhancement (e.g., spatial amplification/directivity) can be a mix of low and high over the second surface of the metal film.

Placement of the dielectric and metal almost anywhere along the radome is acceptable, and the placement can impact the metal/air interface curvature, accuracy and detection range. Non-ceramic, conducting radomes for radio frequency applications can be used when wavelength cutoff of the detector aperture is satisfied; incident angles are accounted for; and stray or parasitic EM energy is controlled. Making this aperture smaller than allowed by cutoff will reject signal. For surface conformal radome applications, the aperture is at a strong incident angle for boresight targets, where before field of view tuning of the surface plasmon polariton enhancement of the signal, amplitude is also influenced by the power pattern of the aperture over angle for the radio frequency cases. This allows for truncating the field of view to reject any illumination generated from behind the sensor, while maintaining the field of view open to target reflections.

In alternative embodiments, a steep change in amplitude of polariton resonance verses variation in incident angle can be determined to modify accuracy. The backface metal film can be roughened, for example, with a mean of approximately $1/1500^{th}$-$1/1000^{th}$ of a wavelength, or approximately 0.006 cm ($2/1000^{th}$ inch) at 10 GHz. The materials will differ depending on the wavelengths of the optical or non-optical energy to be detected. Fused silica has an index of refraction of approximately 1.5 at 1.06 μm wavelength, while versions of Duroid have an index of refraction of 1.5 at a wavelength of 10 GHz. Fresnel response is thus the same for both regardless of frequency. A suitable Duroid, for example, can be Rogers Duroid 5870 available from Rogers Corp., or any other suitable material with similar characteristics.

The detection range is a function of, for example, losses induced by the Fresnel reflection term (for optical and radio wavelengths) at the aperture dielectric surface, window foreshortening or radio frequency power pattern loss. In the case of an optical application of the detector, an avalanche photodiode can be used.

Based on the steep slope of the Fresnel transmission plot, transmittance at strong incidence and specifics of spectrum-dependent characteristics such as window foreshortening or power pattern losses, a detector using available monopulse methods can achieve angle measurement with improved accuracy in comparison to other known systems.

Such a capability of determining direction of incident angle of energy is usable in a system for guiding a munition to the source of the radiated energy. The munition may comprise a body having a control means, and an engine to propel the munition having control surfaces such as fins or other aerodynamic control surfaces that respond to a guidance means which receives a signal output from the detector.

Figure 5:
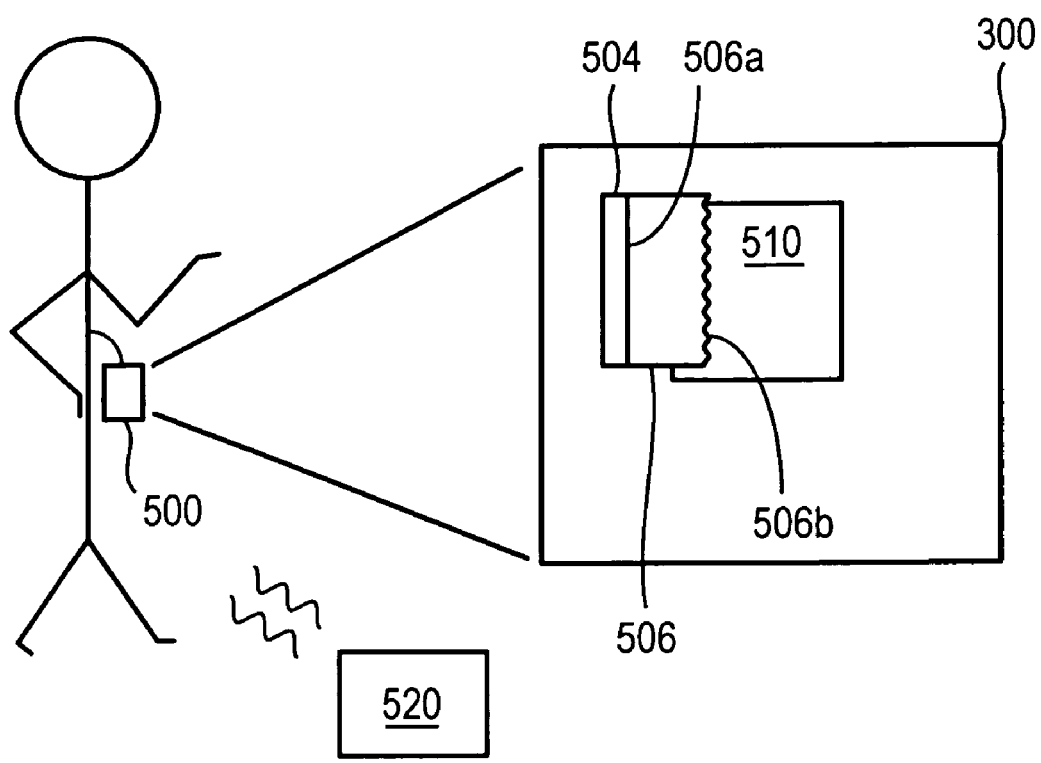
FIG. 5 is an exemplary embodiment directed to radio frequency identification.

Another use of the detector is in an identification device system as illustrated in FIG. 5, such as a passive radio frequency identification detector, or tag. Numerous other applications, such as any application where signal enhancement/directivity is desired, will be readily apparent to those skilled in the art.

In FIG. 5, an exemplary identification device 500 is illustrated comprising a dielectric layer 504 and a metal film 506 having a first surface 506a adjacent to the dielectric layer 504, and a second surface 506b from which electromagnetic energy is generated due to the stimulation of surface plasmon polaritons. The system employing the identification device 500 can use optical and/or non-optical EM energy for transmitting and receiving purposes.

The identification device 500 comprises a circuit which detects electromagnetic energy generated by the surface plasmon polaritons and outputs a signal that can be used to determine information related to the identification device 500 based on the detected energy. The system can comprise, for example, a receiver for receiving the signal output by the identification device 500, and a transmitter 520 which can transmit a signal in an attempt to identify the identification device 500.

The disclosed detector can be tuned to any desired radio frequency or optical wavelength with proper dielectric and metal film choices. Material features, such as metal film thickness, grating or roughness parameters (including mean height) can be selected and or adjusted to achieve a desired detector operation.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

I claim:

1. An apparatus comprising:
   a dielectric layer for receiving incident electromagnetic (EM) energy;

a metal film having a first surface adjacent the dielectric layer, the metal film having a thickness selected to stimulate surface plasmon polaritons on a second surface of the metal film for EM energy having a given EM wavelength incident on the dielectric layer; and a circuit configured to determine an incident angle of the incident EM energy based on EM energy from the stimulated surface plasmon polaritons.

2. The apparatus of claim 1, wherein the second surface of the metal film is rough in comparison to the first surface of the metal film.

3. The apparatus of claim 1, wherein the first surface of the metal film is warped to tune the apparatus to a selected field of view.

4. The apparatus of claim 1, wherein the circuit comprises:

a processor having at least one channel for configured to determine the incident angle of the EM energy on the dielectric layer.

5. The apparatus of claim 1, comprising:

a waveguide for transporting energy of the surface plasmon polaritons to the circuit.

6. The apparatus of claim 5, wherein the waveguide is an RF waveguide.

7. The apparatus of claim 5, wherein the waveguide is a fiber optic cable.

8. The apparatus of claim 1, wherein the circuit detects an amplitude of EM energy generated by the surface plasmon polaritons to determine the incident angle of the EM energy.

9. The apparatus of claim 8, wherein a roughness of the second surface of the metal film is selected to produce a desired amplitude of EM energy at the second surface.

10. The apparatus of claim 1, wherein the dielectric layer has a thickness of approximately 0.100 inches.

11. The apparatus of claim 1, wherein the circuit determines an elevation of the EM energy incident on the dielectric layer.

12. The apparatus of claim 1, wherein the circuit determines an azimuth of the EM energy incident on the dielectric layer.

13. A method for determining an incident angle of an electromagnetic (EM) wave, the method comprising:

receiving an EM wave on a surface of plural windows, each including a dielectric medium adjacent to a metal film, wherein the metal film has a first surface and a second surface;

measuring a first amplitude of EM energy generated on the second surface of the metal film adjacent to the dielectric medium of a first of the plural windows;

measuring a second amplitude of EM energy generated on the second surface of the metal film adjacent to the dielectric medium of a second of the plural windows which is geometrically opposed to the first window;

combining the measured first amplitude with a second amplitude to produce a difference value and a summed value of the first and second measured amplitudes;

dividing the difference value by the summed value to output a resultant value representing the incident angle of the received EM wave.

14. The method of claim 13, comprising:

determining the incident angle of the received EM wave based on a beta angle error curve.

15. The method of claim 13, wherein the EM energy results from surface plasmon polaritons.

16. The method of claim 15, comprising:

tuning the second surface of the metal film to change a wavelength of the EM energy generated by the surface plasmon polaritons.

17. The method of claim 16, wherein the tuning is performed by roughening the second surface of the metal film.

* * * * *